United States Patent
Rajagopal et al.

(10) Patent No.: US 9,000,799 B1
(45) Date of Patent: Apr. 7, 2015

(54) METHOD TO ACHIEVE TRUE FAIL SAFE COMPLIANCE AND ULTRA LOW PIN CURRENT DURING POWER-UP SEQUENCING FOR MOBILE INTERFACES

(71) Applicant: Texas Instruments Incorporated, Dallas, TX (US)

(72) Inventors: Devraj Matharampallil Rajagopal, Bangalore (IN); Rajagopalan P, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 65 days.

(21) Appl. No.: 14/043,565

(22) Filed: Oct. 1, 2013

(51) Int. Cl.
*H03K 19/007* (2006.01)
*H03K 19/0185* (2006.01)

(52) U.S. Cl.
CPC ...... *H03K 19/007* (2013.01); *H03K 19/018521* (2013.01)

(58) Field of Classification Search
CPC . H03K 19/007; H03K 19/0185; H03K 17/22; H03K 2217/0036
USPC .................. 326/14, 83, 62, 93; 327/141–143
See application file for complete search history.

(56) References Cited

U.S. PATENT DOCUMENTS

| | | | | |
|---|---|---|---|---|
| 5,345,422 A * | 9/1994 | Redwine | .................. | 365/189.09 |
| 6,204,701 B1 * | 3/2001 | Tsay et al. | ..................... | 327/143 |
| 6,853,221 B1 * | 2/2005 | Wert | ............................. | 327/143 |
| 2009/0089605 A1 * | 4/2009 | Westwick et al. | ............. | 713/340 |
| 2012/0300556 A1 * | 11/2012 | Tanzawa et al. | ......... | 365/189.05 |

* cited by examiner

*Primary Examiner* — Don Le
(74) *Attorney, Agent, or Firm* — John R. Pessetto; Frank D. Cimino (57) ABSTRACT

An input/output (IO) circuit powered by an input/output (IO) supply voltage. The IO circuit includes a supply detector cell that detects a core supply voltage and generates a supply detect signal. A driver circuit is connected to a PAD and the driver circuit receives the supply detect signal. A failsafe circuit receives a PAD voltage. The failsafe circuit and the supply detector cell controls a leakage current from the PAD based on the IO supply voltage and the PAD voltage.

20 Claims, 9 Drawing Sheets

METHOD TO ACHIEVE TRUE FAIL SAFE COMPLIANCE AND ULTRA LOW PIN CURRENT DURING POWER-UP SEQUENCING FOR MOBILE INTERFACES

TECHNICAL FIELD

Embodiments of the disclosure relate generally to integrated circuits (ICs) and more particularly to controlling PAD current or pin current during power-up sequence or power-down sequence in the integrated circuits.

BACKGROUND

The ever-increasing complexity and performance requirements of portable media devices call for effective system-level power management in Integrated circuits (ICs). Having one or more Switchable Power-Domains in Core-logic is a well-known low-power methodology that is employed for ICs in portable media devices. When a supply of a specific Power Domain is powered down, the outputs of that power-domain serving as inputs to IO (input/output) circuits are no longer valid and these IO circuits need to be tristated to avoid possible leakage current. An IO circuit drive/receive signals on a PAD to interface with the outside world. If the IO circuit is not properly tristated, it results in high leakage currents (conduction currents) from the PAD into the IO circuit. A similar condition results when the IO supply voltage is powered up or down, while the PAD is held at a logic-HIGH. Serial Low-power Inter-chip Media Bus (SLIMbus) is a standard interface between baseband or application processors and peripheral components in portable media devices. The SLIMbus is a failsafe interface and requires the devices to have ultra low PAD current (or pin current) during powering-up, powering down and in stable power state in portable media devices.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An embodiment provides an input/output (IO) circuit powered by an input/output (IO) supply voltage. The IO circuit includes a supply detector cell that detects a core supply voltage and generates a supply detect signal. A driver circuit is connected to a PAD and the driver circuit receives the supply detect signal. A failsafe circuit receives a PAD voltage. The failsafe circuit and the supply detector cell controls a leakage current from the PAD based on the IO supply voltage and the PAD voltage.

Another embodiment provides an input/output (IO) circuit powered by an input/output (IO) supply voltage. The IO circuit includes a supply detector cell that detects a core supply voltage. The IO circuit also includes a pair of level shifter circuits. Each level shifter circuit receives an output of the supply detector cell and translates the output of supply detector cell from a core supply voltage level to an IO supply voltage level. The IO circuit includes a pair of predriver logic circuits. Each predriver logic circuit is connected to an output of a level shifter circuit. The IO circuit includes a pair of gating circuits and each gating circuit is connected to an output of a predriver logic circuit. The IO circuit includes a failsafe circuit that receives a PAD voltage. The failsafe circuit and the supply detector cell controls a leakage current from the PAD based on the IO supply voltage and the PAD voltage.

Another example embodiment provides a method of controlling current through a PAD. The core supply voltage is detected. A failsafe circuit controls a leakage current from a PAD through de-activation of a final driver circuit when the input/output (IO) supply is below a trip-point voltage and PAD is at logic-HIGH. A supply detector cell, when core supply voltage is in OFF state, controls the leakage current from the PAD through de-activation of the final driver circuit when the IO supply voltage is above a trip-point voltage and PAD is at logic-HIGH.

An example embodiment provides a computing device that includes a processing unit and a memory module coupled to the processing unit. A plurality of logic circuits is coupled to the processing unit and the memory module. An input/output (IO) circuit is coupled to at least one logic circuit of the plurality of logic circuits. The IO circuit includes a supply detector cell that detects a core supply voltage and generates a supply detect signal. A driver circuit is connected to a PAD and the driver circuit receives the supply detect signal. A failsafe circuit receives a PAD voltage. The failsafe circuit and the supply detector cell controls a leakage current from the PAD based on the IO supply voltage and the PAD voltage.

Other aspects and example embodiments are provided in the Drawings and the Detailed Description that follows.

DETAILED DESCRIPTION OF THE EMBODIMENTS

Figure 1:
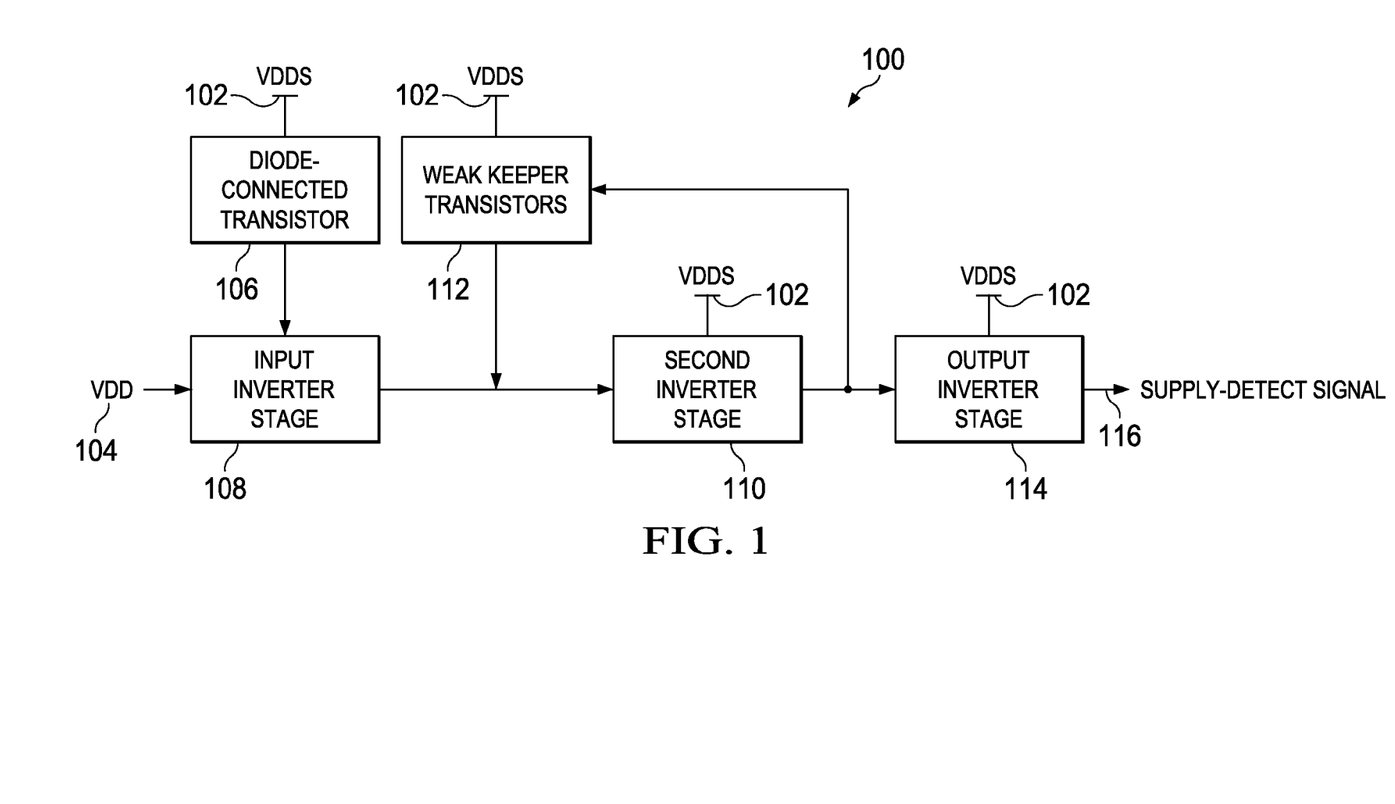
FIG. 1 illustrates a block diagram of a supply detector cell, according to an embodiment.

FIG. 1 illustrates a block diagram of a supply detector cell 100, according to an embodiment. The supply detector cell 100 is powered by an input/output (IO) supply voltage (VDDS) 102 and receives a core supply voltage (VDD) 104 as an input signal. A diode connected transistor 106 is powered by the IO supply voltage (VDDS) 102. The diode connected transistor 106 is one of the following, but not limited to, an NMOS transistor and a PMOS transistor. An input inverter stage 108 is coupled to the diode connected transistor 106. The input inverter stage 108 receives the core supply voltage (VDD) 104. A second inverter stage 110 receives an output of the input inverter stage 108 and is powered by the IO supply voltage (VDDS) 102. A pair of weak keeper transistors 112 is coupled to an output of the second inverter stage 110. The pair of weak keeper transistors 112 are connected in series and powered by the IO supply voltage (VDDS) 102. An output of the pair of weak keeper transistors 112 is provided as input to the second inverter stage 110 which is also the output of the input inverter stage 108. An output inverter stage 114 is coupled to the second inverter stage 110 and generates a supply detect signal 116. The output inverter stage 114 is powered by the IO supply voltage (VDDS) 102.

The operation of the supply detector cell 100 illustrated in FIG. 1 is explained now. The supply detector cell 100 is configured to detect the core supply voltage (VDD) 104 and generate the supply detect signal 116. When the core supply voltage (VDD) 104 is in OFF state and IO supply voltage (VDDS) 102 is ramping up, the diode connected transistor 106 is turned ON. As a result, the output of the input inverter stage 108 is (IO supply voltage (VDDS)–Vtn). Vtn is a threshold voltage of diode connected transistor 106. The output of the input inverter stage 108 (IO supply voltage (VDDS)–Vtn), which is a weak logic-HIGH, is inverted by the second inverter stage 110. Thus, the output of the second inverter stage 110 becomes weak logic-LOW. The pair of weak keeper transistors 112 on receiving this weak logic-LOW signal pull the output of the input inverter stage 108 to an IO supply voltage (VDDS) level from (VDDS–Vtn). This provides for zero static leakage current in the second inverter stage 110 as a logic-HIGH signal is now provided to the second inverter stage 110. This logic-HIGH signal received at the second inverter stage 110 results in a logic-LOW signal at the output of the second inverter stage 110. The logic-LOW signal output of the second inverter stage 110 is provided as input to the output inverter stage 114 that results in a logic-HIGH supply detect signal 116. The output inverter stage 114 thus buffers the output of the input inverter stage 108. The functioning of the circuit 100 is further illustrated with the help of FIG. 2.

Figure 2:
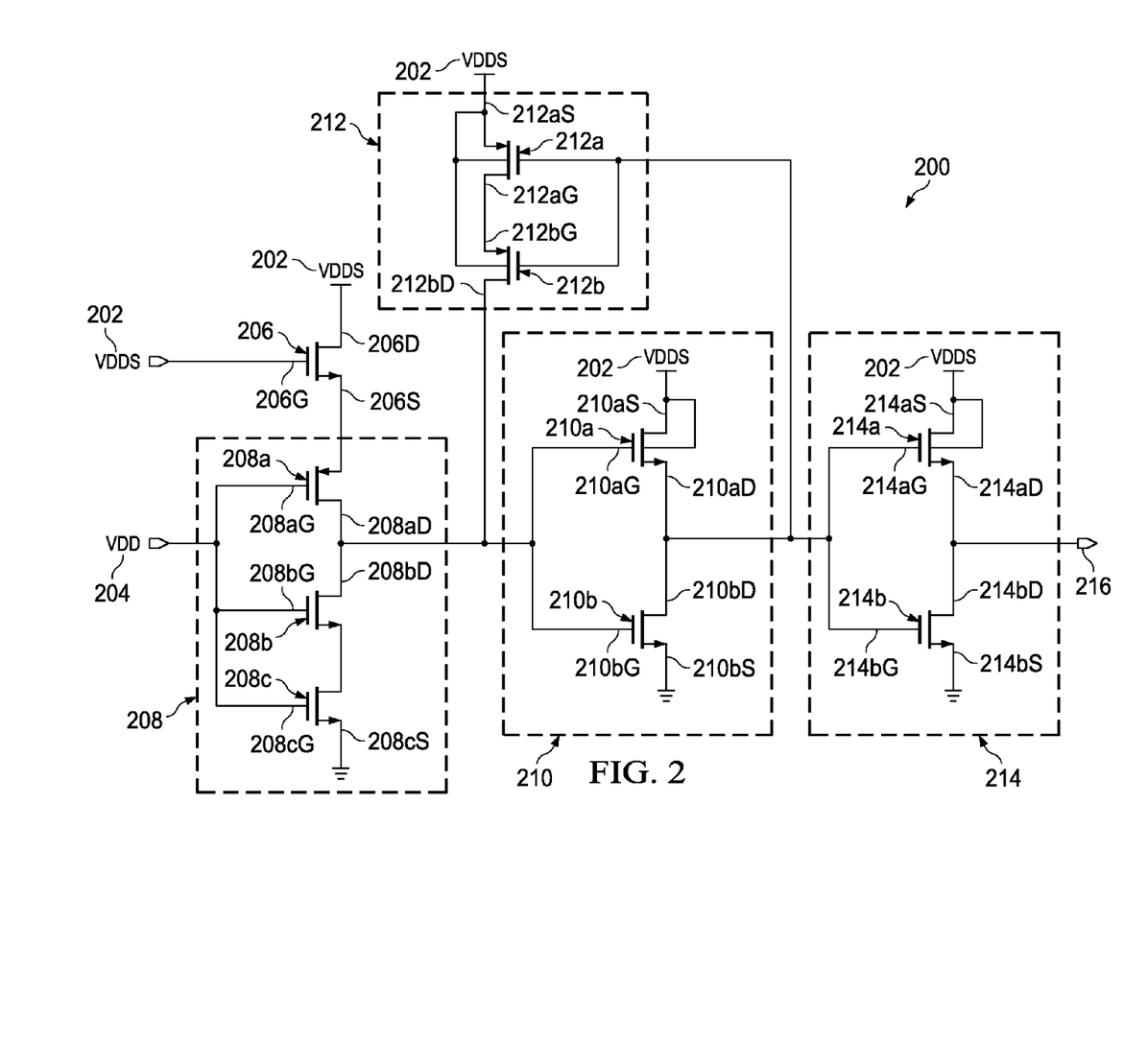
FIG. 2 illustrates a schematic of a supply detector cell, according to an embodiment.

FIG. 2 illustrates a schematic of a supply detector cell 200, according to an embodiment. The supply detector cell 200 is similar in connections and operation to supply detector cell 100. The supply detector cell 200 is powered by an input/output (IO) supply voltage (VDDS) 202 and receives a core supply voltage (VDD) 204. A diode connected NMOS transistor 206 is powered by the IO supply voltage (VDDS) 202. The diode connected NMOS transistor 206 includes a gate terminal 206G and a drain terminal 206D connected to the IO supply voltage (VDDS) 202. In one embodiment, the diode connected NMOS transistor 206 is a PMOS transistor. An input inverter stage 208 is coupled to the diode connected NMOS transistor 206. The input inverter stage 208 includes a PMOS transistor 208a and two NMOS transistors 208b and 208c connected in series. Gate terminals 208aG, 208bG and 208cG of the three transistors 208a, 208b and 208c respectively receive the core supply voltage (VDD) 204. Drain terminals 208aD and 208bD of the respective transistors 208 a and 208b are combined to generate an output of the input inverter stage 208. A second inverter stage 210 receives the output of the input inverter stage 208. The second inverter stage 210 includes a PMOS transistor 210a and an NMOS transistor 210b. A source terminal 210aS of the PMOS transistor 210a receives the IO supply voltage (VDDS) 202. Gate terminals 210aG and 210bG receives the output of the input inverter stage 208. Drain terminals 210aD and 210bD of the transistors 210a and 210b respectively are combined to generate an output of the second inverter stage 210. A pair of weak keeper transistors 212 is coupled to the output of the second inverter stage 210. The pair of weak keeper transistors includes a top PMOS transistor 212a and a bottom PMOS transistor 212b connected in series. Gate terminals 212aG and 212bG of the top PMOS transistor 212a and the bottom PMOS transistor 212b respectively are combined together to receive the output of the second inverter stage 210. A source terminal 212aS of the top PMOS transistor 212a is coupled to the IO supply voltage (VDDS) 202 and a drain terminal 212bD of the bottom PMOS transistor 212b is coupled to the output of the input inverter stage 208, which is also the input to the second inverter stage 210. An output inverter stage 214 is coupled to the second inverter stage 210 and generates a supply detect signal 216. The output inverter stage 214 includes a PMOS transistor 214a and an NMOS transistor 214b. A source terminal 214aS of the PMOS transistor 214a is connected to the IO supply voltage (VDDS) 202. Gate terminals 214aG and 214bG receives the output of the second inverter stage 210. Drain terminals 214aD and 214bD of the transistors 214a and 214b respectively are combined to generate the supply detect signal 216. Source terminals 208cS, 210bS and 214bS of the transistors 208c, 210b and 214b are connected to a ground terminal. The PMOS transistors 208a, 210a and 214a receive the IO supply voltage (VDDS) 202 at a substrate as well. In one embodiment, an inverter stage in supply detector cell 200 is replaced by any inverter known in the art. Those skilled in the art will appreciate that one or more of the devices, features, operations, processes, characteristics, or other qualities of a specifically disclosed embodiment may be removed, replaced, added to, or changed without exceeding the scope of the present disclosure.

The operation of the supply detector cell 200 illustrated in FIG. 2 is explained now. The supply detector cell 200 is configured to detect the core supply voltage (VDD) 204 and generate the supply detect signal 216. When the core supply voltage (VDD) 204 is in OFF state, the NMOS transistors 208b and 208c are in OFF state. When the IO supply voltage (VDDS) 202 starts ramping and becomes more than a threshold voltage (Vtn) of the diode connected NMOS transistor 206, the diode connected NMOS transistor 206 is turned ON. As a result, the output of the input inverter stage 208 is (VDDS–Vtn). The voltage of (VDDS–Vtn), which is a weak logic-HIGH is inverted by the second inverter stage 210 whose output becomes weak logic-LOW. The pair of weak keeper transistors 212 on receiving this weak logic-LOW signal pulls the output of the input inverter stage 208 to an IO supply voltage (VDDS) level from (VDDS–Vtn). This provides for zero static leakage current in the second inverter stage 210 as a logic-HIGH signal is provided to the second inverter stage 210. The logic-HIGH signal received at the second inverter stage 210 results in a logic-LOW signal at an output of the second inverter stage 210. The logic-LOW signal output of the second inverter stage 210 is provided as input to the output inverter stage 214 that results in a logic-HIGH supply detect signal 216. The output inverter stage 214 thus buffers the output of the input inverter stage 208. The supply detector cell 200 provides a logic-HIGH supply detect signal 216 when the core supply voltage (VDD) 204 is in OFF state. The logic-HIGH supply detect signal can be used to tristate associated input/output circuits. The supply detector cell 200 has the advantage that when the IO supply voltage (VDDS) 202 ramps up, the supply detect signal 216 also ramps up with IO supply voltage (VDDS) 202. In addition, the supply detector cell 200 generates zero static current from the IO supply voltage (VDDS) 202 at all values of core supply voltage (VDD) 204.

In a state when IO supply voltage (VDDS) 202 is stable and core supply voltage (VDD) ramps up, the NMOS transistors 208b and 208c are turned ON, thus pulling the output of the input inverter stage 208 to a logic-LOW. The supply detect signal 216 is also pulled to a logic-LOW. In this condition, the PMOS transistor 208a will be in OFF stage if the source-gate voltage (Vsg) of the PMOS transistor 208a is less than a threshold voltage (Vtp) of the PMOS transistor 208a.

$$Vsg=VDDS-Vtn-\text{Core supply voltage}<Vtp \quad (1)$$

As long as the condition of equation (1) is met across process, voltage and temperature combinations, it results in a zero static current consumption in the supply detector cell 200. Thus, the supply detector cell 200 finds application across multiple IO circuits, operating conditions and different ranges of core supply voltage (VDD) that satisfy (1). This is further illustrated with reference to FIG. 3(a) and FIG. 3(b).

Figure 3A:
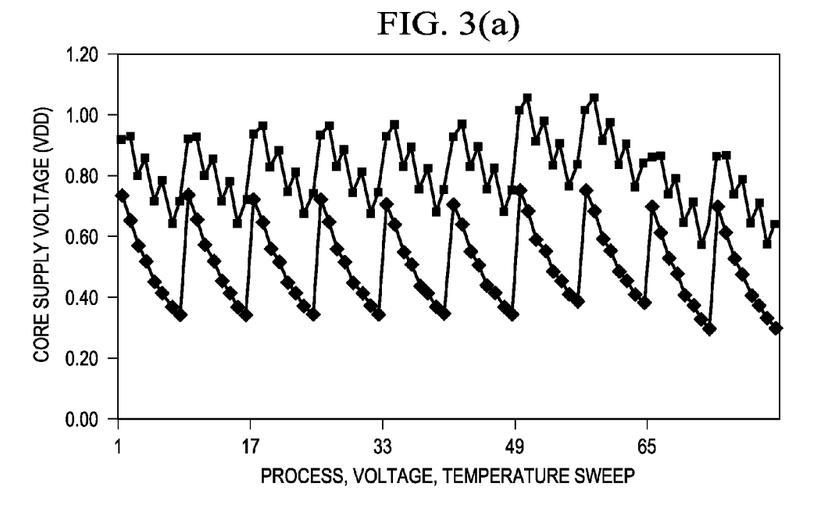
FIG. 3(a) an example representation illustrating functionality of the supply detector cell with respect to different operating conditions, in accordance with one embodiment.

FIG. 3(a) is an example representation illustrating the functionality of the supply detector, viz. the core-supply values at which the supply detect signal switches to logic-HIGH and logic-LOW, when core-supply powers down and powers-up respectively. These core-supply voltage values (Y-axis) are plotted with respect to different operating conditions (X-axis), in accordance with one embodiment.

Figure 3B:
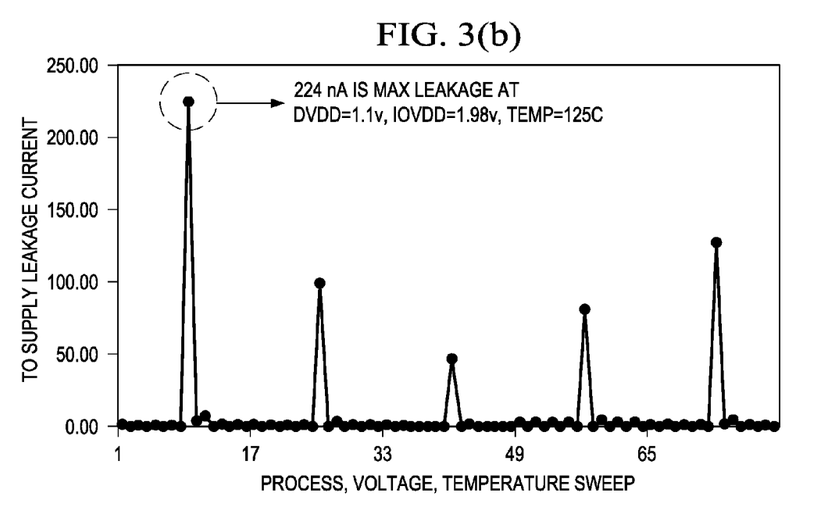
FIG. 3(b) an example representation illustrating leakage current in the supply detector cell with respect to different operating conditions, in accordance with one embodiment.

FIG. 3(b) is an example representation illustrating the zero-static current behavior of the supply detector at different states of the core supply voltage (VDD) and IO supply voltage (VDDS). The leakage current through the IO supply voltage (VDDS) is plotted with respect to different operating conditions, in accordance with one embodiment. It can be seen that the maximum IO supply leakage current is 224nA at core supply voltage (VDD) value of 1.1V, IO supply voltage (VDDS) value of 1.98V and temperature of 125 C.

Figure 4:
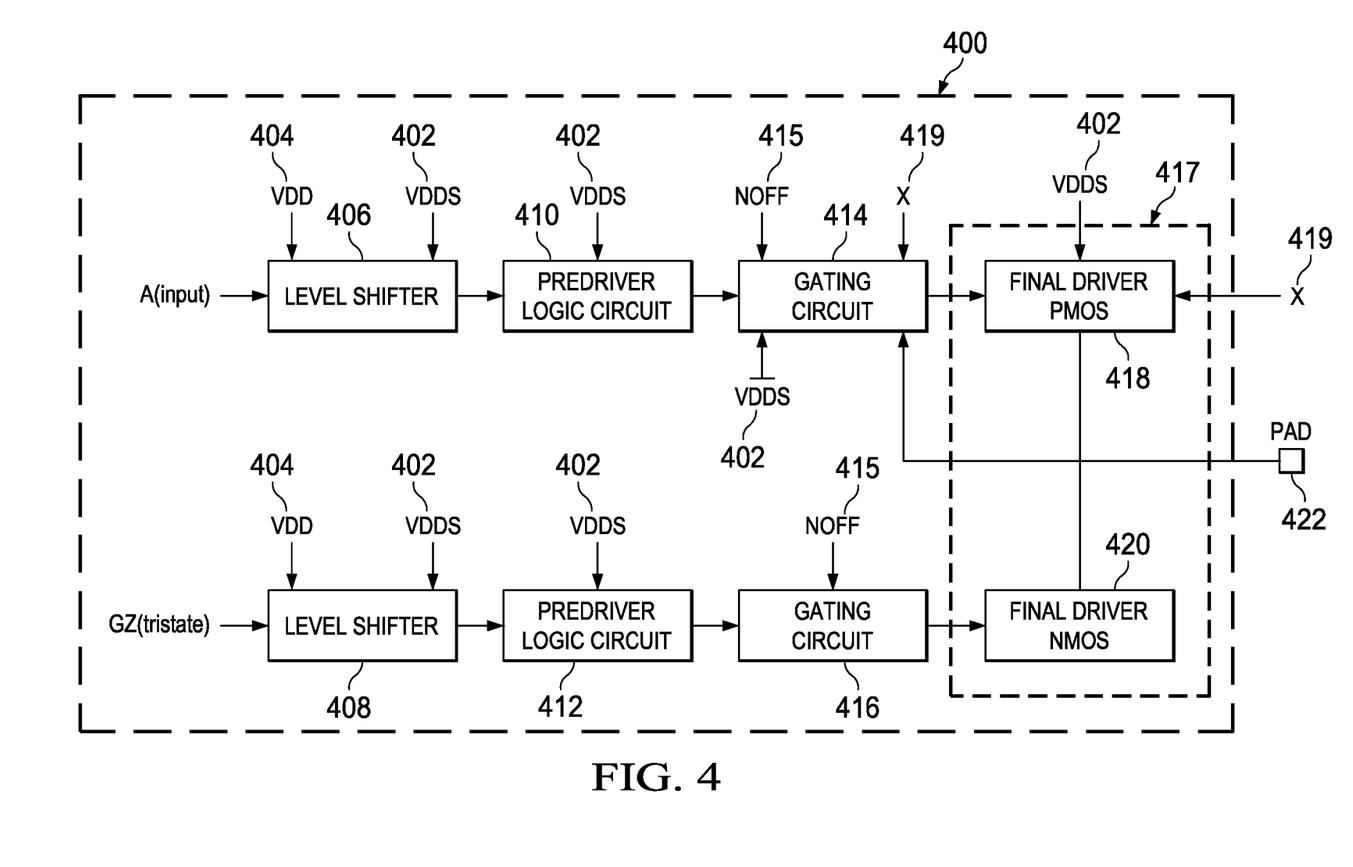
FIG. 4 illustrates a block diagram of a driver circuit coupled to a PAD, according to an embodiment.

FIG. 4 illustrates a block diagram of a driver circuit 400 coupled to a PAD 422, according to an embodiment. The driver circuit 400 is powered by an IO (input/output) supply voltage (VDDS) 402. The driver circuit 400 includes a pair of level shifter circuits 406 and 408. The level shifter circuit 406 receives an input signal A and the level shifter circuit 408 receives a tristate signal GZ, as respective inputs. In addition, the pair of level shifter circuits 406 and 408 receives the core supply voltage (VDD) 404 and the IO supply voltage (VDDS) 402. The driver circuit 400 also includes a pair of predriver logic circuits 410 and 412. Each predriver logic circuit is coupled to an output of the level shifter circuit i.e. the predriver logic circuit 410 is coupled to an output of level shifter circuit 406 and the predriver logic circuit 412 is coupled to an output of level shifter circuit 408. The pair of predriver logic circuits 410 and 412 is powered by IO supply voltage (VDDS) 402. A pair of gating circuits 414 and 416 is coupled to the pair of predriver logic circuits 410 and 412 respectively. The gating circuit 414 is coupled to an output of predriver logic circuit 410 and the gating circuit 416 is coupled to an output of predriver logic circuit 412. The pair of gating circuits 414 and 416 receives a control signal (Noff) 415 from a failsafe circuit (not illustrated in figure). The gating circuit 414 also receives the IO supply voltage (VDDS) 402 and a substrate signal (X) 419 from the failsafe circuit. A final driver circuit 417 is coupled to the pair of gating circuits 414 and 416. The final driver circuit 417 includes a final driver PMOS transistor 418 and a final driver NMOS transistor 420. The final driver PMOS transistor 418 is powered by the IO supply voltage (VDDS) 402 and receives a substrate signal (X) 419 from the failsafe circuit (not illustrated in figure). The PAD 422 is coupled to the final driver circuit 417. The pair of level shifter circuits 406 and 408, the pair of predriver logic circuits 410 and 412, the gating circuit 416 and the final driver NMOS transistor 420 are also connected to a ground terminal. The operation of the driver circuit 400 is explained later in the specification with reference to FIG. 5.

Figure 5:
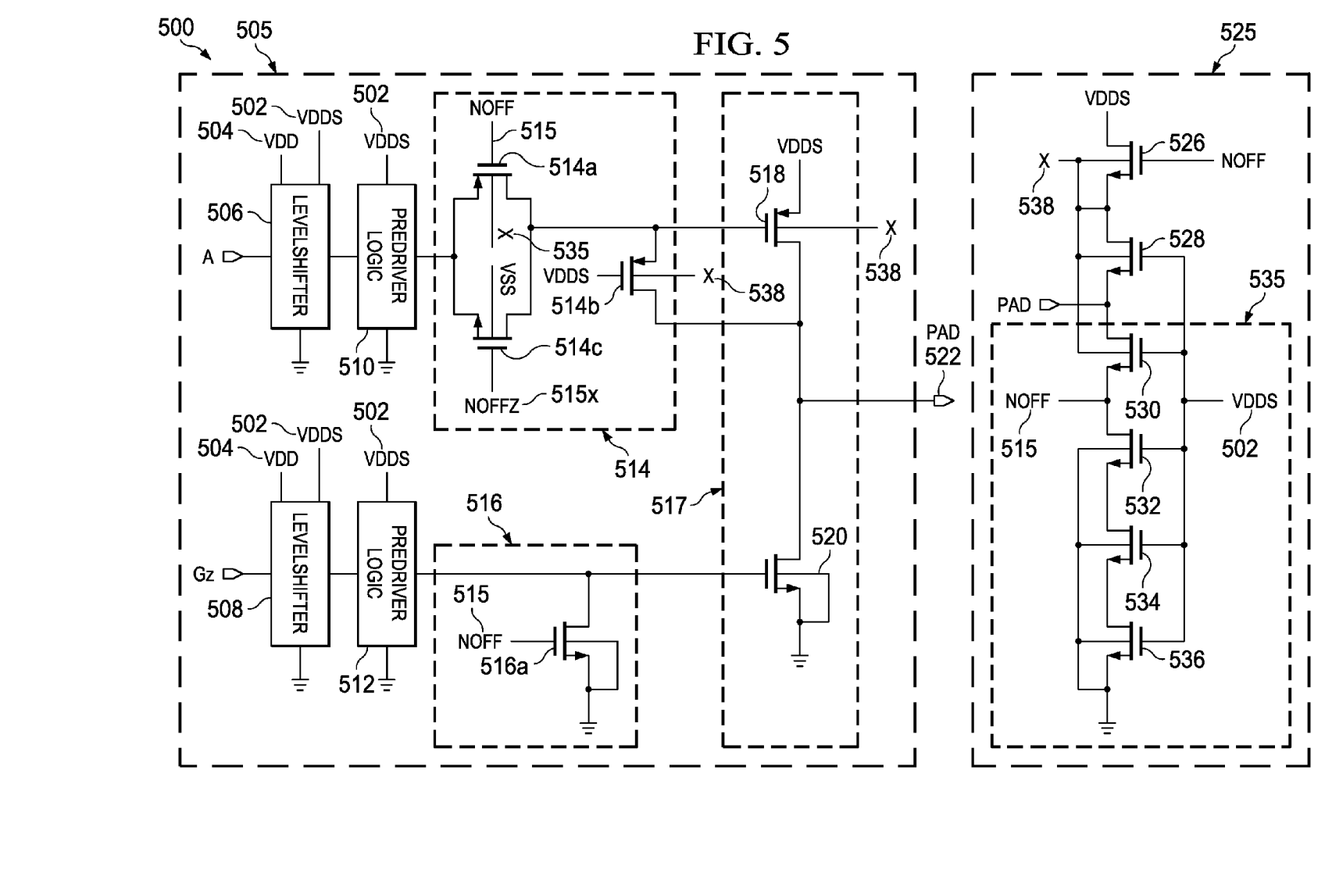
FIG. 5 illustrates a schematic of an input/output (IO) circuit, according to an embodiment.

FIG. 5 illustrates a schematic of an input/output (IO) circuit 500, according to an embodiment. The IO circuit 500 includes a driver circuit 505, a PAD 522 and a failsafe circuit 525. The driver circuit 505 is similar in connections and operation to the driver circuit 400. The driver circuit 500 is powered by an IO (input/output) supply 502. The driver circuit 500 includes a pair of level shifter circuits 506 and 508. The level shifter circuit 506 receives an input signal A and the level shifter circuit 508 receives a tristate signal GZ. In addition, the level shifter circuits 506 and 508 receive the core supply voltage (VDD) 504 and the IO supply voltage (VDDS) 502. The driver circuit 500 also includes a pair of predriver logic circuits 510 and 512. Each predriver logic circuit is coupled to an output of the level shifter circuit i.e. the predriver logic circuit 510 is coupled to an output of the level shifter circuit 506 and the predriver logic circuit 512 is coupled to an output of the level shifter circuit 508. The pair of predriver logic circuits 510 and 512 is powered by IO supply voltage (VDDS) 502.

A pair of gating circuits 514 and 516 is coupled to the pair of predriver logic circuits 510 and 512 respectively. The gating circuit 514 is coupled to an output of the predriver logic circuit 510 and the gating circuit 516 is coupled to an output of the predriver logic circuit 512. The gating circuit 514 includes two PMOS transistors 514a and 514b and an NMOS transistor 514c. The PMOS transistor 514a receives a control signal (Noff) 515 at a gate terminal and a substrate signal (X) 538 at a body terminal from the failsafe circuit 525. The PMOS transistor 514b receives the IO supply voltage (VDDS) 502 at a gate terminal and the substrate signal (X) 538 at a body terminal. The NMOS transistor 514c receives an inverted control signal (Noffz) 515X at a gate terminal. The gating circuit 516 includes an NMOS transistor 516a. The NMOS transistor 516a receives the control signal (Noff) 515 at a gate terminal from the failsafe circuit 525 and its source terminal is connected to ground. A final driver circuit 517 is coupled to the pair of gating circuits 514 and 516. The final driver circuit 517 includes a final driver PMOS transistor 518 and a final driver NMOS transistor 520. The final driver PMOS transistor 518 receives the IO supply voltage (VDDS) 502 at a source terminal and receives the substrate signal (X) 538 at a body terminal. An output of the gating circuit 514 is connected to a gate terminal of the final driver PMOS transistor 518. A gate terminal of the final driver NMOS transistor 520 is connected to an output the gating circuit 516. The source terminal of the final driver NMOS transistor 520 is connected to ground terminal. The PAD 522 is coupled to the final driver circuit 517.

The failsafe circuit 525 generates the control signal (Noff) 515 and the substrate signal (X) 538. The failsafe circuit 525 includes a first PMOS transistor 526, a second PMOS transistor 528 and an inverting stage 535. A source terminal of the first PMOS transistor 526 is connected to the IO supply voltage (VDDS) 502. A drain terminal of the second PMOS transistor 528 is connected to the PAD 522 and a gate terminal of the second PMOS transistor 528 is connected to the IO supply voltage (VDDS) 502. A source terminal of the second PMOS transistor 528, the drain terminal of the first PMOS transistor 526, body terminal of the first PMOS transistor 526 and the body terminal of second PMOS transistor 528 are combined together to generate the substrate signal (X) 538. The inverting stage 535 of the failsafe circuit 525 includes a third PMOS transistor 530, a first NMOS transistor 532, a second NMOS transistor 534 and a third NMOS transistor 536. The first NMOS transistor 532, the second NMOS transistor 534 and the third NMOS transistor 536 are connected in cascode arrangement. Gate terminals of the third PMOS transistor 530, the first NMOS transistor 532, the second NMOS transistor 534 and the third NMOS transistor 536 are configured to receive the IO supply voltage (VDDS) 502. A source terminal of the third PMOS transistor 530 is connected to the PAD 522. A drain terminal of the first NMOS transistor 532 is connected to a drain terminal of the third PMOS transistor 530 to generate the control signal (Noff) 515. A source terminal of a third NMOS transistor 536 is connected to ground. Those skilled in the art will appreciate that one or more of the devices, features, operations, processes, characteristics, or other qualities of a specifically disclosed embodiment may be removed, replaced, added to, or changed without exceeding the scope of the present disclosure.

The operation of the IO circuit 500 illustrated in FIG. 5 is explained now. The pair of level shifter circuits 506 and 508 translates a signal from a core supply voltage (VDD) level to an IO supply voltage (VDDS) level. This is required as the IO circuit (the pair of predriver logic circuits 510 and 512, final driver circuit 517 and the failsafe circuit 525) operates on IO supply voltage (VDDS) 502. The pair of predriver logic circuits 510 and 512 implement a logic based on the level-shifted versions of the input signal A and the tristate signal GZ. The final driver PMOS transistor 518 and the final driver NMOS transistor 520 are in turn controlled by output of the pair of predriver logic circuits 510 and 512. The pair of predriver logic circuits 510 and 512 implements the following truth table according to an embodiment:

| GZ | A | PAD |
|---|---|---|
| 0 | 0 | 0 |
| 0 | 1 | 1 |
| 1 | 0 | High-Impedance |
| 1 | 1 | High-Impedance | wherein 'High-Impedance' state is achieved when both final driver PMOS transistor 518 and final driver NMOS transistor 520 are in OFF state.

In one of the operating modes, the PAD 522 is at logic-HIGH, IO supply voltage (VDDS) is powered down and the final driver PMOS transistor 518 and the final driver NMOS transistor 520 are not turned OFF, then it results in either leakage currents (conduction currents) from the PAD 522 to the IO supply voltage (VDDS) 502 through the final driver PMOS transistor 518 or leakage currents (conduction currents) from the PAD 522 to the ground terminal through the final driver NMOS transistor 520. The failsafe circuit 525 avoids this operating mode by correctly turning OFF the final driver PMOS transistor 518 and final driver NMOS transistor 520. The failsafe circuit 525 generates the control signal (Noff) 515 to turn OFF final driver PMOS transistor 518 and final driver NMOS transistor 520. The failsafe circuit 525 is powered by a PAD voltage and receives the supply voltage (VDDS) 502. The PAD voltage is the voltage at the PAD 522. When there is no IO supply voltage (VDDS) 502 and the PAD voltage is at logic-HIGH, the PMOS transistor 530 turns ON and passes the logic-HIGH voltage on the PAD 522 to the control signal (NOFF) signal 515. Also the PMOS transistor 528 turns ON and pulls up the substrate signal (X) 538 also to logic-HIGH. As the control signal (NOFF) 515 is at logic-HIGH, the PMOS 526 is turned OFF. The logic-HIGH control signal (Noff) 515 turns OFF the final driver NMOS transistor 520 by pulling the gate terminal of the NMOS 520 to ground. The PMOS transistor 514a and the NMOS transistor 514c are also turned OFF by the logic-HIGH control signal (Noff) 515 and the logic-LOW inverted control signal (NoffZ) 515X respectively, thus cutting off the output of the predriver logic circuit 510 from the final driver PMOS transistor 518. As the PAD voltage is at logic-HIGH, the gate terminal of the final driver PMOS transistor 518 is pulled up to logic-HIGH by the PMOS 514b, which is turned ON due to IO supply voltage (VDDS) 502 at its gate terminal and PAD voltage at its drain, thus avoiding any leakage current (conduction current) from the PAD 522 to the IO supply voltage (VDDS) 502 through the final driver PMOS transistor 518. Also since the substrate signal (X) 538 is pulled to logic-HIGH, this avoids forward-biasing the internal pn-junction of the final driver PMOS 518. The failsafe circuit 525 is effective when the IO supply voltage (VDDS) 502 is below a trip-point voltage. In an embodiment, this trip-point voltage is dependent on a threshold voltage of the transistors in the inverting stage 535 in the failsafe circuit 525. In an embodiment, the trip-point voltage is selected by designing the relative widths of the PMOS transistor 530 and the cascoded NMOS transistors 532,534 and 536 in the failsafe circuit 525. The extent of skewing the ratio of widths of the PMOS transistor 530 and the cascoded NMOS transistors 532,534 and 536 decides the trip-point voltage during IO supply voltage (VDDS) 502 ramp-up, when NOFF trips from logic-HIGH to logic-LOW. When PAD 522 is at logic-HIGH, and the IO supply voltage (VDDS) 502 is above the trip-point voltage, then the control signal (Noff) 515 is turned OFF and hence the final driver PMOS transistor 518 and final driver NMOS transistor 520 are not turned OFF. This causes leakage currents (conduction currents) from the PAD 522 to the IO supply voltage (VDDS) 502 or to the ground terminal. This is further illustrated with reference to FIG. 6(a) and FIG. 6(b).

Figure 6A:
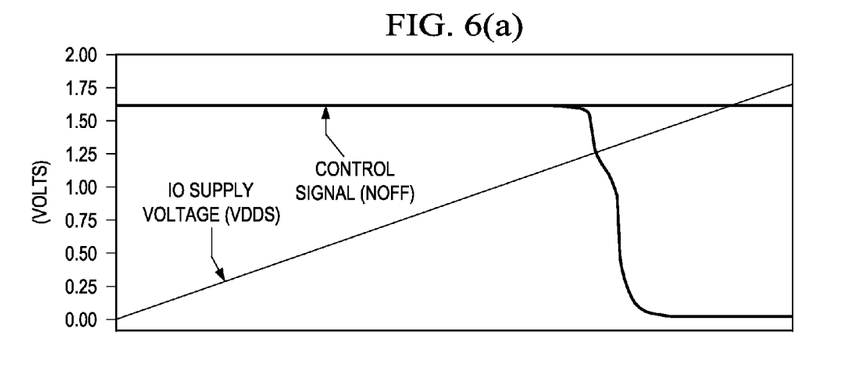
FIG. 6(a) is an example graph illustrating the response of a control signal (Noff) to the IO supply voltage, according to an embodiment.

FIG. 6(a) is an example graph illustrating the response of a control signal (Noff) 515 to the IO supply voltage (VDDS) 502, according to an embodiment. As illustrated, the control signal (Noff) 515, remains constant when IO supply voltage (VDDS) 502 increases as a ramp function from 0 volt to 1.98 volt. However, when the IO supply voltage (VDDS) 502 exceeds the trip-point voltage, which is 1.25 volt in the exemplarily illustrated graph, the control signal (Noff) 515 is turned OFF.

Figure 6B:
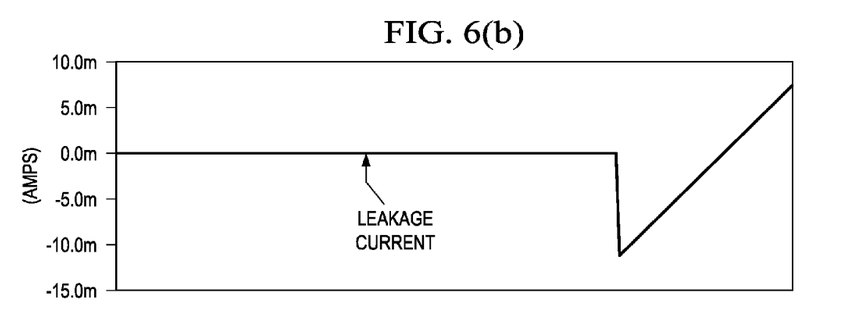
FIG. 6(b) is an example graph illustrating the leakage current (conduction current) from the PAD, according to an embodiment.

FIG. 6(b) is an example graph illustrating the conduction (leakage) current from the PAD 522 to the IO supply voltage (VDDS) 502 when the IO supply voltage (VDDS) 502 exceed the trip-point voltage and PAD 522 is at logic-HIGH. The graph illustrates a huge spike in leakage current (conduction current) (about 20 mA) from the pad at the trip-point voltage.

Figure 7A:
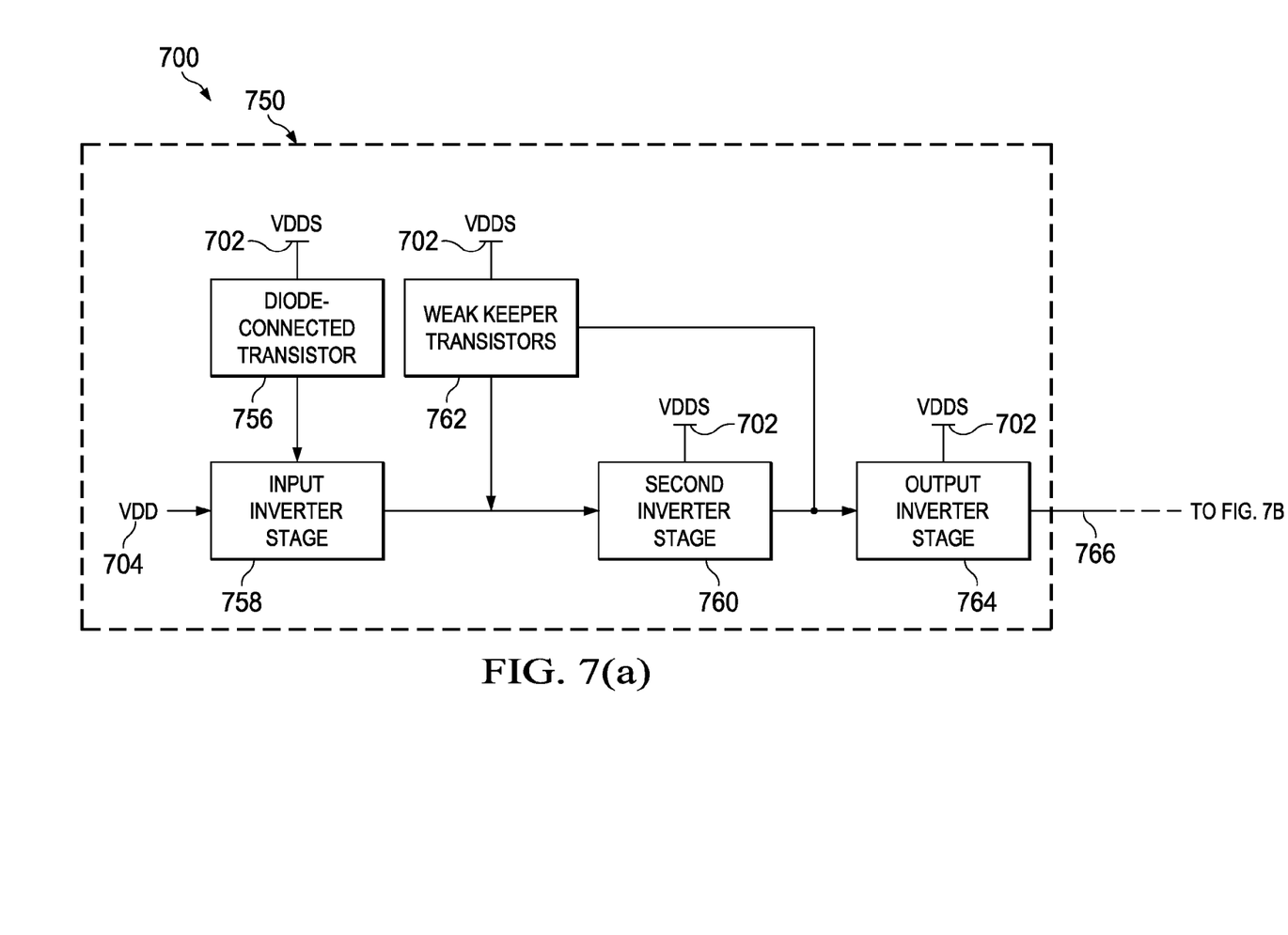
FIG. 7(a) and FIG. 7(b) illustrates a schematic of an input/output (IO) circuit, according to an embodiment.
Figure 7B:
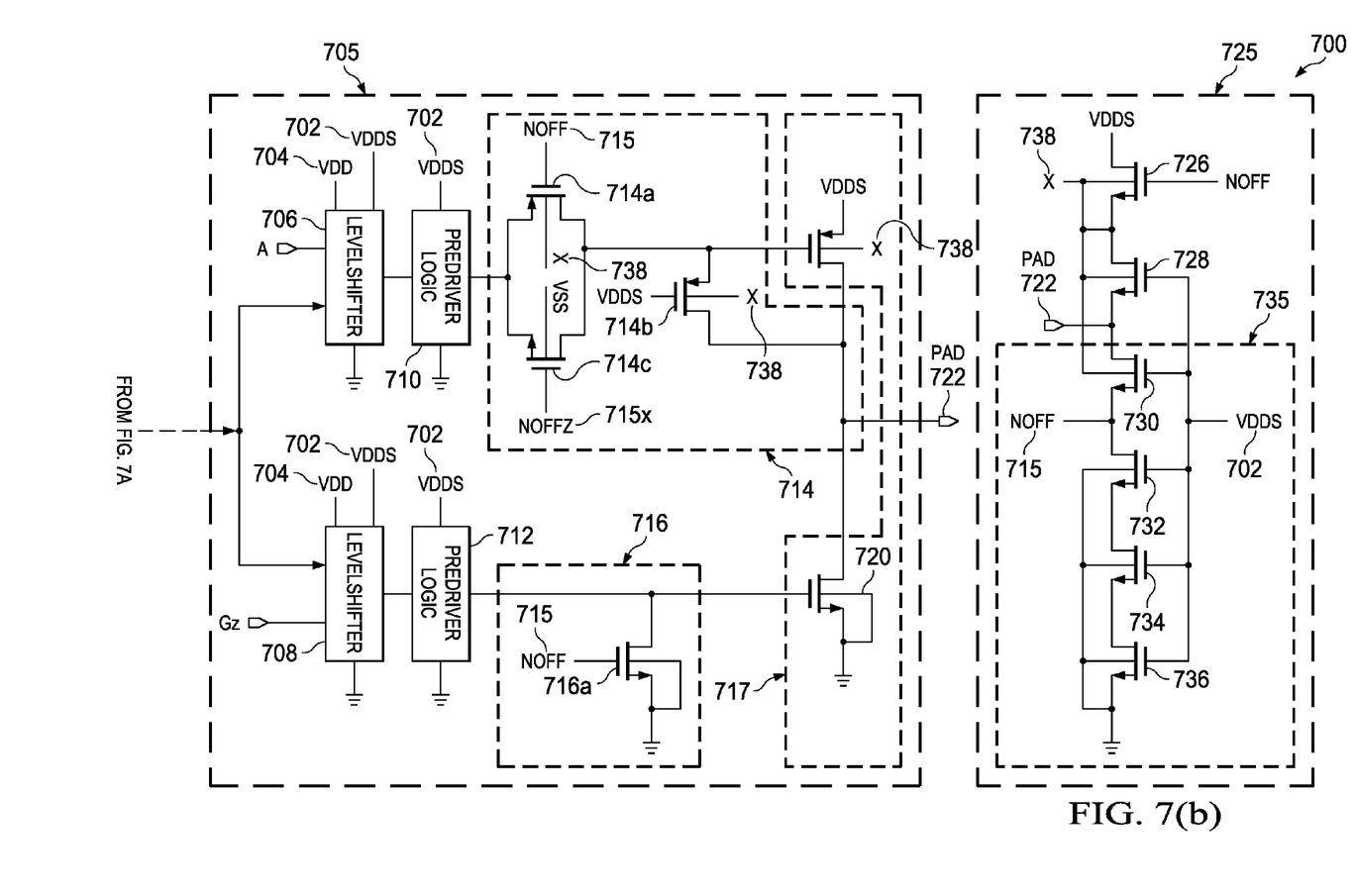

FIG. 7(a) and FIG. 7(b) illustrate a schematic of an input/output (IO) circuit 700, according to an embodiment. The IO circuit 700 includes a driver circuit 705, a PAD 722, a failsafe circuit 725 and a supply detector cell 750. The driver circuit 705 is similar in connections and operation to driver circuit 500. The failsafe circuit 725 is similar in connections and operation to the failsafe circuit 525. The supply detector cell 750 is similar in connections and operation to the supply detector cell 100.

The supply detector cell 750 is powered by an input/output (IO) supply 702 and receives a core supply voltage (VDD) 704, as an input signal. A diode connected transistor 756 is powered by the IO supply voltage (VDDS) 702. The diode connected transistor 756 is one of the following, but not limited to, an NMOS transistor and a PMOS transistor. An input inverter stage 758 is coupled to the diode connected transistor 756. The input inverter stage 758 receives the core supply voltage (VDD) 704. The second inverter stage 760 receives an output of the input inverter stage 758 and is powered by the IO supply voltage (VDDS) 702. A pair of weak keeper transistors 762 is coupled to an output of the second inverter stage 760. The pair of weak keeper transistors 762 are connected in series and powered by the IO supply voltage (VDDS) 702. An output of the pair of weak keeper transistors 762 is provided as input to the second inverter stage 760 which is also the output of the input inverter stage 758. An output inverter stage 764 is coupled to the second inverter stage 760 and generates a supply detect signal 766. The output inverter stage 764 is powered by the IO supply voltage (VDDS) 702.

The driver circuit 705 is powered by an IO (input/output) supply 702. The driver circuit 700 includes a pair of level shifter circuits 706 and 708. The level shifter circuit 706 receives an input signal A and the level shifter circuit 708 receives a tristate signal GZ. The pair of level shifter circuits 706 and 708 receive the supply detect signal 766 from the supply detector cell 750. In addition, the level shifter circuits 706 and 708 receive the core supply voltage (VDD) 704 and the IO supply voltage (VDDS) 702. The driver circuit 700 also includes a pair of predriver logic circuits 710 and 712. Each predriver logic circuit is coupled to an output of the level shifter circuit i.e. the predriver logic circuit 710 is coupled to an output of the level shifter circuit 706 and the predriver logic circuit 712 is coupled to an output of the level shifter circuit 708. The pair of predriver logic circuits 710 and 712 is powered by IO supply voltage (VDDS) 702.

A pair of gating circuits 714 and 716 is coupled to the pair of predriver logic circuits 710 and 712 respectively. The gating circuit 714 is coupled to an output of the predriver logic circuit 710 and the gating circuit 716 is coupled to an output of the predriver logic circuit 712. The gating circuit 714 includes two PMOS transistors 714a and 714b and an NMOS transistor 714c. The PMOS transistor 714a receives a control signal (Noff) 715 at a gate terminal and a substrate signal (X) 738 at a body terminal from the failsafe circuit 725. The PMOS transistor 714b receives the IO supply voltage (VDDS) 702 at a gate terminal and the substrate signal (X) 738 at a body terminal. The NMOS transistor 714c receives an inverted control signal (Noffz) 715X at a gate terminal. The gating circuit 716 includes an NMOS transistor 716a. The NMOS transistor 716a receives the control signal (Noff) 715 at a gate terminal from the failsafe circuit 725 and connected to ground at a source terminal. A final driver circuit 717 is coupled to the pair of gating circuits 714 and 716. The final driver circuit 715 includes a final driver PMOS transistor 718 and a final driver NMOS transistor 720. The final driver PMOS transistor 718 receives the IO supply voltage (VDDS) 702 at a source terminal and receives the substrate signal (X) 738 at a body terminal. An output of the gating circuit 714 is connected to a gate terminal of the final driver PMOS transistor 718. A gate terminal of the final driver NMOS transistor 720 is connected to an output of the gating circuit 716. The source terminal of the final driver NMOS transistor 720 is connected to ground terminal. The PAD 722 is coupled to the final driver circuit 715. The pair of level shifter circuits 706 and 708 and the pair of predriver logic circuits 710 and 712 are also connected to the ground terminal.

The failsafe circuit 725 generates the control signal (Noff) 715 and the substrate signal (X) 738. The failsafe circuit 725 includes a first PMOS transistor 726, a second PMOS transistor 728 and an inverting stage 735. The source terminal of the first PMOS transistor 726 is configured to receive the IO supply voltage (VDDS) 702. A drain terminal of the second PMOS transistor 728 is connected to the PAD 722 and a gate terminal of the second PMOS transistor 728 is connected to the supply voltage (VDDS) 702. A source terminal of the second PMOS transistor 728, the drain terminal of the first PMOS transistor 726, body terminal of the first PMOS transistor 726 and the body terminal of second PMOS transistor 728 are combined together to generate the substrate signal (X) 738. The inverting stage 735 of the failsafe circuit 725 includes a third PMOS transistor 730, a first NMOS transistor 732, a second NMOS transistor 734 and a third NMOS transistor 736. The first NMOS transistor 732, the second NMOS transistor 734 and the third NMOS transistor 736 are connected in cascode arrangement. Gate terminals of the third PMOS transistor 730, the first NMOS transistor 732, the second NMOS transistor 734 and the third NMOS transistor 736 are configured to receive the IO supply voltage (VDDS) 702. A source terminal of the third PMOS transistor 730 is connected to the PAD 722. A drain terminal of the first NMOS transistor 732 is connected to a drain terminal of the third PMOS transistor 730 to generate the control signal (Noff) 715. A source terminal of a third NMOS transistor 736 is connected to ground. Those skilled in the art will appreciate that one or more of the devices, features, operations, processes, characteristics, or other qualities of a specifically disclosed embodiment may be removed, replaced, added to, or changed without exceeding the scope of the present disclosure.

The operation of the IO circuit 700 illustrated in FIG. 7 is explained now. The supply detector cell 750 is configured to detect the core supply voltage (VDD) 704 and generate the supply detect signal 766. The pair of level shifter circuits 706 and 708 translates a signal from a core supply voltage (VDD) level to an IO supply voltage (VDDS) level. This is required as the IO circuit (the pair of predriver logic circuits 710 and 712, final driver circuit 717 and the failsafe circuit 725) operates on IO supply voltage (VDDS) 702. The supply detect signal 766 is also received as an input to the pair of level-shifter circuits 706 and 708. The pair of predriver logic circuits 710 and 712 implement a logic based on the level-shifted versions of the input signal A and the tristate signal GZ. The input signal A and the tristate signal GZ are modified based on the supply-detect signal 766 received by the pair of level shifters circuits 706 and 708. The finals driver PMOS transistor 718 and the final driver NMOS transistor 720 are controlled by output of predriver logic circuits 710 and 712. When core supply voltage (VDD) is in OFF state, then the supply detect signal 766 is in logic-HIGH state. In this case, outputs of the pair of level shifter circuits 706 and 708 is logic-HIGH and this turns OFF both the final driver PMOS transistor 718 and final driver NMOS transistor 720.

In the failsafe IO, in one of the operating modes, the PAD 722 is at logic-HIGH, IO supply voltage (VDDS) 702 is powered down and the final driver PMOS transistor 718 and final driver NMOS transistor 720 are not turned OFF, this results in either leakage currents (conduction currents) from the PAD 722 to the IO supply voltage (VDDS) 702 through the final driver PMOS transistor 718 or leakage currents (conduction currents) from the PAD 722 to the ground terminal through the final driver NMOS transistor 720. The failsafe circuit 725 avoids this operating mode by correctly turning OFF the final driver PMOS transistor 718 and final driver NMOS transistor 720. The failsafe circuit 725 generates the control signal (Noff) 715 to turn OFF final driver PMOS transistor 718 and final driver NMOS transistor 720. The failsafe circuit 725 receives a PAD voltage and the IO supply voltage (VDDS) 702. The PAD voltage is the voltage at the PAD 722. When there is no IO supply voltage (VDDS) 702 and the PAD voltage is at logic-HIGH, the, the PMOS transistor 730 turns ON and passes the logic-HIGH voltage on the PAD 722 to the control signal (Noff) 715. Also the PMOS 728 turns ON and pulls up the substrate signal (X) 738 also to logic-HIGH. As the control signal (NOFF) 715 is at logic-HIGH, the PMOS 526 is turned OFF. The logic-HIGH control signal (Noff) 715 turns OFF the final driver NMOS transistor 720 by pulling the gate terminal of the NMOS 720. The PMOS transistor 714a and the NMOS transistor 714c are also turned OFF by the logic-HIGH control signal (Noff) 715 and the logic-LOW inverted control signal (NoffZ) 715X respectively, thus cutting off the output of the predriver logic circuit 710 from the final driver PMOS transistor 718. As the PAD voltage is at logic-HIGH, the gate terminal of the final driver PMOS transistor 718 is pulled up to logic-HIGH by the PMOS 714b, which is turned ON due to IO supply voltage (VDDS) 702 at its gate terminal and PAD voltage at its drain, thus avoiding any leakage current (conduction current) from the PAD 722 to the IO supply voltage (VDDS) 702 through the final driver PMOS transistor 718. Also since the substrate signal (X) 738 is pulled to logic-HIGH, this avoids forward-biasing the internal pn-junction of the final driver PMOS 718. The failsafe circuit 725 is effective when the IO supply voltage (VDDS) 702 is below a trip-point voltage. In an embodiment, the trip-point voltage is dependent on a threshold voltage of the transistors in the inverting stage 735 in the failsafe circuit 725. In an embodiment, the trip-point voltage is selected by designing the relative widths of the PMOS transistor 730 and the cascoded NMOS transistors 732,734 and 736 in the failsafe circuit 725. The extent of skewing the ratio of widths of the PMOS transistor 730 and the cascoded NMOS transistors 732,734 and 736 decides the trip-point voltage during IO supply voltage (VDDS) ramp-up, when NOFF trips from logic-HIGH to logic-LOW. Thus, the failsafe circuit 725 controls the leakage current (conduction current) through de-activation of the final driver circuit 715, when the PAD 722 is at logic-HIGH and the IO supply voltage (VDDS) 704 is below the trip-point voltage. However, when the core supply voltage (VDD) 704 is in OFF state, the PAD 722 is at logic-HIGH and the IO supply voltage (VDDS) 702 is above the trip-point voltage, then the control signal (Noff) 715 is turned OFF. Thus, the final driver PMOS transistor 718 and final driver NMOS transistor 720 are not correctly gated resulting in leakage currents. This state is avoided by the supply detector cell 750.

When the core supply voltage (VDD) 704 is in OFF state and IO supply voltage (VDDS) 702 is ramping up, the diode connected transistor 756 is turned ON. As a result, the output of the input inverter stage 758 is (VDDS−Vtn). Vtn is a threshold voltage of diode connected transistor 756. The output of the input inverter stage 758 (IO supply voltage (VDDS)−Vtn), which is a weak logic-High, is inverted by the second inverter stage 760. Thus, the output of second inverter stage 760 becomes weak logic-LOW. The pair of weak keeper transistors 762 on receiving this weak logic-LOW signal pull the output of the input inverter stage 758 to the IO supply voltage (VDDS) level from (VDDS−Vtn). This provides for zero static leakage current in the second inverter stage 760 as a logic-HIGH signal is now provided to the second inverter stage 760. The logic-HIGH signal received at the second inverter stage 760 results in a logic-LOW signal at an output of the second inverter stage 760. The logic-LOW signal output of the second inverter stage 760 is provided as input to the output inverter stage 764 that results in a logic-HIGH supply detect signal 766. The output inverter stage 764 thus buffers the output of the input inverter stage 758. A logic-HIGH supply detect signal 766 is provided to the pair of level shifter circuits 706 and 708. The outputs of the pair of level shifter circuits 706 and 708 become logic-HIGH, that in turn drive the outputs of the pair of predriver logic circuits 710 and 712 to logic-HIGH and logic-LOW respectively, thus turning OFF both the final driver PMOS transistor 718 and final driver NMOS transistor 720 using predriver logic circuits 710 and 712. Thus, the supply detector cell 750, when core supply voltage (VDD) 704 is in OFF state, turns OFF or deactivates the final driver circuit 717 when the IO supply voltage (VDDS) 702 is above the trip-point voltage. Therefore, the IO circuit 700 provides very low leakage current from the PAD 722 when the core supply voltage (VDD) is in OFF state and the IO supply voltage (VDDS) 702 is above the trip-point, even when PAD is at logic-HIGH. This method of choosing the trip-point by skewing relative widths of the PMOS transistor 730 and the NMOS transistors 732,734,734 is used in controlling the maximum PAD current/pin-current. During power-down sequencing, when IO supply voltage (VDDS) 702 ramps-down, before the trip-point, the supply detector disables the final driver circuit 717, when core-supply is LOW. Below the trip-point voltage, the failsafe circuit 725 and gating circuits 714 and 716 disable/tristate the final driver. The IO circuit 700 provides ultra low PAD current (pin current) during powering up or powering-down of a failsafe 10 interface such as the SLIMbus interface and thereby achieving true fail safe compliance.

Figure 8A:
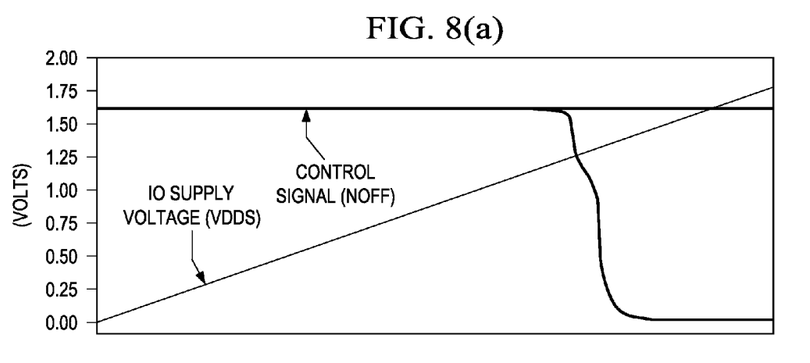
FIG. 8(a) is an example graph illustrating the response of a control signal (Noff) to the IO supply voltage, according to an embodiment.

FIG. 8(*a*) is an example graph illustrating the response of a control signal (Noff) 715 to the IO supply voltage (VDDS) 702, according to an embodiment. As illustrated, the control signal (Noff) 715, remains constant when IO supply voltage (VDDS) 702 increases as a ramp function from 0 volt to 1.25 volt. However, when the IO supply voltage (VDDS) 702 exceeds the trip-point voltage, which is 1.25 volt in the exemplarily illustrated graph, the control signal (Noff) 715 is turned OFF.

Figure 8B:
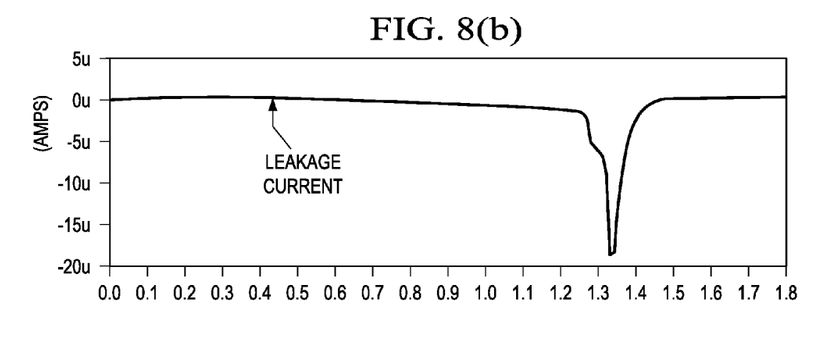
FIG. 8(b) is an example graph illustrating the leakage current (conduction current) from the PAD, according to an embodiment.

FIG. 8(*b*) is an example graph illustrating the leakage current from the PAD 722 to the IO supply voltage (VDDS) 702 when the IO supply voltage (VDDS) 702 exceeds the trip-point voltage. The graph illustrates that leakage current from the PAD 722 to IO supply voltage (VDDS) 702 is negligible as the supply detector cell 750 deactivates the final driver circuit 717 when the PAD voltage is at logic-HIGH and the IO supply voltage (VDDS) is above the trip-point voltage.

Figure 9:
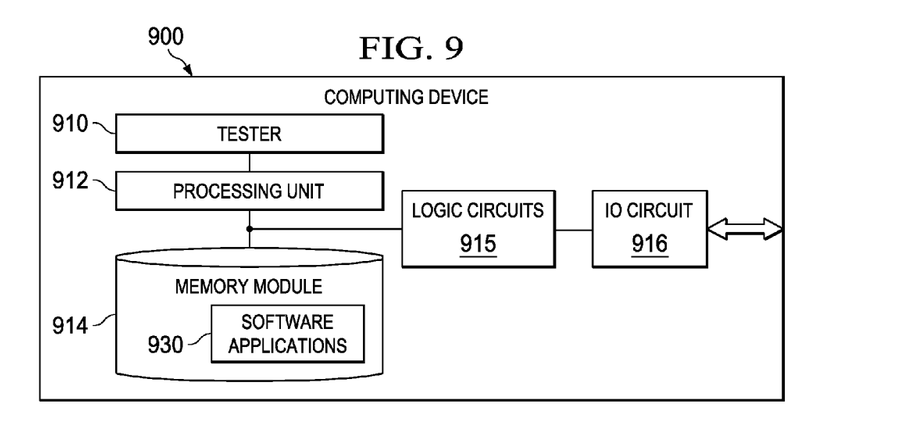
FIG. 9 illustrates a computing device according to an embodiment.

FIG. 9 illustrates a computing device according to an embodiment. The computing device 900 is, or is an integrated circuit incorporated into, a mobile communication device, such as a mobile phone, a personal digital assistant, a personal computer, or any other type of electronic system.

In some embodiments, the computing device 900 can be one of, but not limited to, microcontroller, microprocessor or a system-on-chip (SoC) which includes a processing unit 912 such as a CPU (Central Processing Unit), a memory unit 914 (e.g., random access memory (RAM)) and a tester 910. The processing unit 912 can be, for example, a CISC-type (Complex Instruction Set Computer) CPU, RISC-type CPU (Reduced Instruction Set Computer), or a digital signal processor (DSP). The memory module 914 (which can be memory such as RAM, flash memory, or disk storage) stores one or more software applications 930 (e.g., embedded applications) that, when executed by the processing unit 912, perform any suitable function associated with the computing device 900. The tester 910 comprises logic that supports testing and debugging of the computing device 900 executing the software application 930. For example, the tester 910 can be used to emulate a defective or unavailable component(s) of the computing device 900 to allow verification of how the component(s), were it actually present on the computing device 900, would perform in various situations (e.g., how the component(s) would interact with the software application 930). In this way, the software application 930 can be debugged in an environment which resembles post-production operation.

The processing unit 912 typically comprises cache-memory and logic which store and use information frequently accessed from the memory module 914 and is responsible for the complete functionality of the computing device. The computing device 900 includes a plurality of logic circuits 915 coupled to the processing unit 912 and the memory module 914. An IO circuit 916 is coupled to at least one logic circuit of the plurality of logic circuits 915. The IO circuit 916 acts as an interface between the computing device 900 and the external world. The IO circuit 916 is analogous to the IO circuit 700 in connection and operation. The IO circuit 916 has low leakage current from the PAD during power-up sequence, power-down sequence and also during stable powered up states, as it uses the failsafe circuitry mechanism when the IO supply voltage (VDDS) is below the trip-point voltage and the core-supply detection mechanism when the IO supply voltage (VDDS) is above the trip-point voltage.

In the foregoing discussion, the terms "connected" means at least either a direct electrical connection between the devices connected or an indirect connection through one or more passive intermediary devices. The term "circuit" means at least either a single component or a multiplicity of passive or active components, that are connected together to provide a desired function. The term "signal" means at least one current, voltage, charge, data, or other signal. Also, the terms "connected to" or "connected with" (and the like) are intended to describe either an indirect or direct electrical connection. Thus, if a first device is coupled to a second device, that connection can be through a direct electrical connection, or through an indirect electrical connection via other devices and connections. Further, the term "logic-HIGH" is generally intended to describe a signal that is at logic state "1," and the term "logic-LOW" is generally intended to describe a signal that is at logic state "0." Also, the terms "OFF state" or turn "OFF" or turned "OFF" is used to describe a deactivation of a device, a component or a signal. The term turned "ON" describes activation of a device, a component or a signal.

It should be noted that reference throughout this specification to features, advantages, or similar language does not imply that all of the features and advantages should be or are in any single embodiment. Rather, language referring to the features and advantages is understood to mean that a specific feature, advantage, or characteristic described in connection with an embodiment is included in at least one embodiment of the present disclosure. Thus, discussion of the features and advantages, and similar language, throughout this specification may, but do not necessarily, refer to the same embodiment.

Further, the described features, advantages, and characteristics of the disclosure may be combined in any suitable manner in one or more embodiments. One skilled in the relevant art will recognize that the disclosure can be practiced without one or more of the specific features or advantages of a particular embodiment. In other instances, additional features and advantages may be recognized in certain embodiments that may not be present in all embodiments of the disclosure.

One having ordinary skill in the art will understand that the present disclosure, as discussed above, may be practiced with steps and/or operations in a different order, and/or with hardware elements in configurations which are different than those which are disclosed. Therefore, although the disclosure has been described based upon these preferred embodiments, it should be appreciated that certain modifications, variations, and alternative constructions are apparent and well within the spirit and scope of the disclosure. In order to determine the metes and bounds of the disclosure, therefore, reference should be made to the appended claims.

What is claimed is:

1. An input/output (IO) circuit powered by an input/output (IO) supply voltage comprising:
    a supply detector cell configured to detect a core supply voltage and generate a supply detect signal;
    a driver circuit connected to a PAD and configured to receive the supply detect signal; and
    a failsafe circuit configured to receive a PAD voltage, wherein the failsafe circuit and the supply detector cell are configured to control a leakage current from the PAD based on the IO supply voltage and the PAD voltage.

2. The IO circuit of claim 1, wherein the driver circuit comprises:
    a pair of level shifter circuits, each level shifter circuit is configured to receive the supply detect signal and the core supply voltage and configured to translate the supply detect signal from a core supply voltage level to an IO supply voltage level;
    a pair of predriver logic circuits, each predriver logic circuit is connected to an output of a level shifter circuit;
    a pair of gating circuits, each gating circuit is connected to an output of a predriver logic circuit; and
    a final driver circuit, wherein the failsafe circuit and the pair of predriver logic circuits are configured to drive the pair of gating circuits that deactivates the final driver circuit to control the leakage current from the PAD based on the IO supply voltage and the PAD voltage.

3. The IO circuit of claim 1, wherein the final driver circuit comprises a final driver PMOS transistor and a final driver NMOS transistor.

4. The IO circuit of claim 1, wherein the supply detector cell is powered by the IO supply voltage, the supply detector cell comprises:
    a diode connected transistor coupled to the IO supply voltage;
    an input inverter stage connected to the diode connected transistor and configured to receive the core supply voltage as an input;
    a second inverter stage connected to an output of the input inverter stage;
    a pair of weak keeper transistors coupled in series and gate terminals of the pair of weak keeper transistors are connected to an output of the second inverter stage, wherein the pair of weak keeper transistors is configured to pull the output of the input inverter stage to the IO supply voltage level; and
    an output inverter stage coupled to the second inverter stage, wherein the output inverter stage buffers the output of the input inverter stage and generates a supply detect signal.

5. The IO circuit of claim 4, wherein the diode connected transistor comprises one of an NMOS transistor and a PMOS transistor.

6. The IO circuit of claim 4, wherein the diode connected transistor comprises a drain terminal and a gate terminal connected to the IO supply voltage.

7. The IO circuit of claim 4, wherein the pair of weak keeper transistors comprises a top PMOS transistor and a bottom PMOS transistor connected in series, wherein gate terminals of the top PMOS transistor and the bottom PMOS transistor are configured to receive the output of the second inverter stage, and a source terminal of the top PMOS transistor is connected to the IO supply voltage and a drain terminal of the bottom PMOS transistor is connected to the output of the input inverter stage.

8. The IO circuit of claim 4, wherein the supply detect signal is configured to change based on the IO supply voltage.

9. The IO circuit of claim 4, wherein the supply detect signal is configured to follow the IO supply voltage when the IO supply voltage is a ramp function and the core supply voltage is in OFF state.

10. The IO circuit of claim 1, wherein the supply detector cell is configured to control the leakage current from the PAD through de-activation of the final driver circuit when the IO supply voltage is above a trip-point voltage, and the PAD voltage is at logic-HIGH.

11. The IO circuit of claim 1, wherein the failsafe circuit comprises:
   a first PMOS transistor with a source terminal configured to receive the IO supply voltage;
   a second PMOS transistor with a source terminal connected to the PAD, a gate terminal connected to the IO supply voltage and a drain terminal connected to a drain terminal of the first PMOS transistor to generate a substrate signal, wherein the substrate signal is provided to the final driver PMOS transistor; and
   an inverting stage, wherein the inverting stage comprises:
      a third PMOS transistor with a gate terminal configured to receive the IO supply voltage and a source terminal connected to the PAD;
      a first NMOS transistor with a gate terminal configured to receive the IO supply voltage and a drain terminal connected to a drain terminal of the third PMOS to generate a control signal, wherein the control signal is provided to the pair of gating circuits;
      a second NMOS transistor with a gate terminal configured to receive the IO supply voltage; and
      a third NMOS transistor with a gate terminal configured to receive the IO supply voltage and a source terminal connected to ground, wherein the first NMOS transistor, the second NMOS transistor and the third NMOS transistor are connected in cascode arrangement.

12. An input/output (IO) circuit powered by an input/output (IO) supply voltage comprising:
   a supply detector cell configured to detect a core supply voltage;
   a pair of level shifter circuits, each level shifter circuit is configured to receive an output of the supply detector cell and configured to translate the output of supply detector cell from a core supply voltage level to an IO supply voltage level;
   a pair of predriver logic circuits, each predriver logic circuit is connected to an output of a level shifter circuit;
   a pair of gating circuits, each gating circuit is connected to an output of a predriver logic circuit; and
   a failsafe circuit configured to receive a PAD voltage, wherein the failsafe circuit and the supply detector cell are configured to control a leakage current from the PAD based on the supply voltage and the PAD voltage.

13. A method comprising:
   detecting a core supply voltage;
   configuring a failsafe circuit to control a leakage current from a PAD through de-activation of a final driver circuit when the input/output (IO) supply is below a trip-point voltage and PAD is at logic-HIGH; and
   configuring a supply detector cell, when core supply voltage is in OFF state, to control the leakage current from the PAD through de-activation of the final driver circuit when the supply voltage is above a trip-point voltage and PAD is at logic-HIGH.

14. The method of claim 13 further comprising generating in the supply detector cell a supply detect signal which is configured to follow the IO supply voltage when the IO supply voltage is a ramp function and the core supply voltage is in OFF state.

15. The method of claim 13 further comprising generating a zero static current in the supply detector cell at all values of core supply voltage.

16. The method of claim 13 further comprising powering the supply detector cell by the IO supply voltage, the supply detector cell comprises:
   a diode connected transistor coupled to the IO supply voltage;
   an input inverter stage connected to the diode connected transistor and configured to receive the core supply voltage as an input;
   a second inverter stage connected to an output of the input inverter stage;
   a pair of weak keeper transistors coupled in series and gate terminals of the pair of weak keeper transistors are connected to an output of the second inverter stage, wherein the pair of weak keeper transistors is configured to pull the output of the input inverter stage to the IO supply voltage level; and
   an output inverter stage coupled to the second inverter stage, wherein the output inverter stage buffers the output of the input inverter stage and generates a supply detect signal.

17. The method of claim 13, wherein the failsafe circuit comprises:
   a first PMOS transistor with a source terminal configured to receive the IO supply voltage;
   a second PMOS transistor with a source terminal connected to the PAD voltage, a gate terminal connected to the IO supply voltage and a drain terminal connected to a drain terminal of the first PMOS transistor to generate a substrate signal, wherein the substrate signal is provided to the final driver PMOS transistor; and
   an inverting stage, wherein the inverting stage comprises:
      a third PMOS transistor with a gate terminal configured to receive the IO supply voltage and a source terminal connected to the PAD;
      a first NMOS transistor with a gate terminal configured to receive the IO supply voltage and a drain terminal connected to a drain terminal of the third PMOS to generate a control signal, wherein the control signal is provided to the pair of gating circuits;
      a second NMOS transistor with a gate terminal configured to receive the IO supply voltage; and
      a third NMOS transistor with a gate terminal configured to receive the IO supply voltage and a source terminal connected to ground, wherein the first NMOS transistor, the second NMOS transistor and the third NMOS transistor are connected in cascode arrangement.

18. A computing device comprising:
   a processing unit;
   a memory module coupled to the processing unit;
   a plurality of logic circuits coupled to the processing unit and the memory module; and an input/output (IO) circuit coupled to at least one logic circuit of the plurality of logic circuits, the IO circuit comprising:
  a supply detector cell configured to detect a core supply voltage and generate a supply detect signal;
  a driver circuit connected to a PAD and configured to receive the supply detect signal; and
  a failsafe circuit configured to receive a PAD voltage, wherein the failsafe circuit and the supply detector cell are configured to control a leakage current from the PAD based on the IO supply voltage and the PAD voltage.

19. The computing device of claim 18, wherein the driver circuit comprises:
  a pair of level shifter circuits, each level shifter circuit is configured to receive the supply detect signal and the core supply voltage and configured to translate the supply detect signal from a core supply voltage level to an IO supply voltage level;
  a pair of predriver logic circuits, wherein each predriver logic circuit is connected to an output of a level shifter circuit;
  a pair of gating circuits, wherein each gating circuit is connected to an output of a predriver logic circuit; and
  a final driver circuit, wherein the failsafe circuit and the pair of predriver logic circuits are configured to drive the pair of gating circuits to deactivate the final driver circuit that control the leakage current from the PAD based on the IO supply voltage and the PAD voltage.

20. The computing device of claim 18, wherein the supply detector cell is powered by the IO supply voltage, the supply detector cell comprises:
  a diode connected transistor coupled to the IO supply voltage;
  an input inverter stage connected to the diode connected transistor and configured to receive the core supply voltage;
  a second inverter stage connected to an output of the input inverter stage;
  a pair of weak keeper transistors coupled in series and gate terminals of the pair of weak keeper transistors are connected to an output of the second inverter stage, wherein the pair of weak keeper transistors is configured to pull the output of the input inverter stage to the IO supply voltage level; and
  an output inverter stage connected to the second inverter stage, wherein the output inverter stage buffers the output of the input inverter stage and generates a supply detect signal.

\* \* \* \* \*